INVENTOR.
HUNG CHANG LIN
BY
Gordon H Telfer
ATTORNEY

INVENTOR.
HUNG CHANG LIN
BY
Gordon H Telfer
ATTORNEY

United States Patent Office 3,448,256

Patented June 3, 1969

3,448,256

SEMICONDUCTOR POTENTIOMETRIC DEVICE FOR MULTIPLICATION AND DIVISION

Hung C. Lin, Monroeville, Pa., assignor to Westinghouse Electric Corporation, East Pittsburgh, Pa., a corporation of Pennsylvania Original application Oct. 28, 1960, Ser. No. 65,672, now Patent No. 3,206,619, dated Sept. 14, 1965. Divided and this application Jan. 21, 1965, Ser. No. 426,755

Int. Cl. G06g 7/16

U.S. Cl. 235—195 15 Claims

ABSTRACT OF THE DISCLOSURE

Electronic multiplication and division circuits are provided using the logarithmic characteristics of rectifying junctions of solid state elements that may be contained within a unitary body of semiconductor material.

This application is a division of application Ser. No. 65,672, filed Oct. 28, 1960, now Patent 3,206,619, issued Sept. 14, 1965.

The present invention relates generally to new and improved electronic multiplying and dividing circuits such as those used for performing the functions of a potentiometer and the invention is more particularly concerned with a monolithic semiconductor device for accomplishing this result.

In electronic systems, it often becomes desirable to supply an output which is a function of a number of different inputs. One example of a device for performing this function is a potentiometer wherein the output varies both as a function of the input voltage, which is usually applied across a resistance winding, and also as a function of the position of a tap or arm movable along the winding by a mechanical control. In a linear potentiometer the output is the product of the input voltage and the setting of the control knob or tap while in a logarithmic potentiometer the output varies as the product of the input voltage and the logarithm of the control knob setting. Potentiometers now in use possess a number of disadvantages among which are their excessive weight and size making them undesirable for use in electronic systems such as those employed on missiles or aircraft where miniaturization of components is a primary objective. Perhaps the most important disadvantage of potentiometers presently in use flows from their use of mechanical moving parts which give rise to wear thus making the operation both sluggish and unreliable. The reliance upon moving parts also creates noise which is introduced into the electronic circuits.

A recent trend in the electronic field has been the development of monolithic semiconductor devices wherein all of the conventional parameters of an electronic circuit are formed within a unitary body of semiconductor material. It is possible in devices of the latter type to develop, by presently known techniques, a body of semiconductor material made up of a plurality of alternate P type and N type conductivity layers and including active regions functioning as transistors or other semiconductor junction elements, energy storage regions each formed by a reverse biased PN junction acting as a capacitance and dissipative regions acting as resistances. The present invention is concerned in one aspect with the provision of a monolithic semiconductor device or a portion of such a device employing only known regions interconnected to perform the functions of a potentiometer or, more generally, to perform multiplying and dividing operations. Such a device would not only meet the problem of providing an area of the monolithic semiconductor device acting as a potentiometer but, in addition, since it employs no moving parts and may be constructed in a very small area, it would avoid all of the aforementioned disadvantages of conventional mechanically controlled potentiometers. Thus, it will be apparent that the device of the present invention may be used as a separate circuit element to simulate the action of a potentiometer or, in the alternative, it may be formed as a region of a monolithic semiconductor device which forms a complete electronic circuit.

One of the primary objects of the invention is to provide a new and improved electronic device which acts as a potentiometer but is free from moving parts so that it is highly reliable in operation and does not introduce noise into its associated circuits.

A further object of the invention is to provide a new and improved monolithic semiconductor device or a region of such a device of extremely small size and weight for performing the function of an electronic multiplier or divider.

The invention has for another object the provision of a new and improved method for use in the operation of electronic circuits to obtain an output which is a function of two or more input signals.

The invention has for a further object the provision of a novel construction for use in monolithic semiconductor devices to simulate electronic circuits of the type wherein a p-type conductivity layer must be connected to an n-type semiconductor layer.

An object of the present invention is to provide an electronic multiplier or divider comprising a plurality of p-n junctions formed within a unitary or monolithic body of a semiconductor material, these portions being electrically connected through the bulk of the semiconductor material without any external leads between the several portions.

Another object of the present invention is to provide a monolithic semiconductor device comprising within a unitary body of a semiconductor material, a plurality of p-n junctions and at least one active region, all provided in the body of the material and electrically cooperative, said active region and said p-n junctions being electrically interconnected through the body of the material.

Another object of the present invention is to provide a unitary semiconductor member having a plurality of interrelated doped regions including p-n junctions, and conductive portions, the regions being electrically connected through the bulk of the semiconductor member, the whole being capable of cooperating to function as an electronic multiplier or divider.

The invention, both as to its organization and manner of operation, together with further objects and advantages will best be understood by reference to the following description taken in conjunction with the accompanying drawings wherein.

The forward characteristic of a p-n junction type diode may be expressed generally as:

$$I=I_o\left(\exp.\frac{qV}{kT}-1\right) \qquad (1)$$

where I is the forward current through the junction, $I_o$ is the current coefficient of the junction, $q$ is the charge of a carrier, $k$ is the Boltzmann's constant, T is the absolute temperature in degrees Kelvin and V is the voltage across the junction with positive values of V being forward. Equation 1 is well known in rectifier theory and is derived, for example, in an article by W. Shockley entitled "Theory of p-n Junctions," appearing in the Bell System Technical Journal, volume 28, pages 435–489 (1949). The equation also appears on page 90 of the text "Electrons and Holes in Semiconductors" by William Shockley, published as part of the Bell Laboratory Series by D. Van Nostrand Company, Inc. copyright 1950 (fifth printing). In the range where the spreading resistance of the diode is insignificant, the forward characteristic becomes exponential and, hence, this portion or range of the characteristic may be utilized to perform a logarithmic function. More specifically, in the range where the term $qV/kT$ of Equation 1 becomes much greater than 1, the latter equation reduces to:

$$I=I_o\left(\exp.\frac{qV}{kT}\right)$$

which may be expressed as:

$$\ln I/I_o=\frac{qV}{kT} \qquad (2)$$

Thus, in the range of the diode forward characteristic where Equation 2 is valid, the voltage across the diode is proportional to the logarithm of the forward current since for any given diode all of the terms of Equation 2 are essentially constants except for the current and the voltage, assuming, of course, that the ambient temperature does not vary to any great extent.

Figure 1:
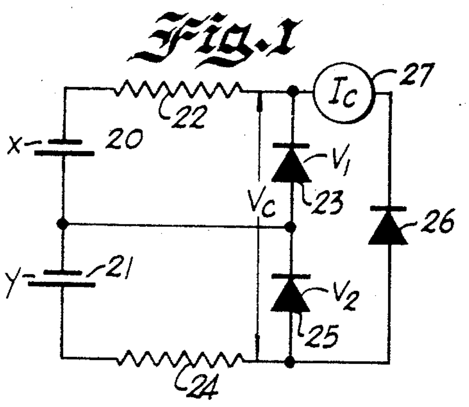
FIGURE 1 is a schematic diagram illustrating an electronic multiplier circuit characterized by the features of the present invention for performing the function of a conventional linear potentiometer.

In FIG. 1, an electronic multiplier circuit is illustrated for performing the functions of a linear potentiometer by following the principle of Equation 2. More specifically, the circuit shown in FIG. 1 comprises a pair of sources 20 and 21 for supplying input voltages $x$ and $y$, respectively. The input voltage $x$ is impressed across an input resistance-diode section consisting of a high resistance 22 connected in series with a p-n junction type rectifier or diode 23. Similarly, the input voltage $y$ is impressed across a second input resistance-diode section consisting of a high resistance 24 connected in series with a second p-n junction type rectifier or diode 25. The resistances 22 and 24 are very high when compared with the forward resistances of the rectifiers 23 and 25. For the electronic multiplier circuit being described the rectifiers 23 and 25 are so poled that the voltages $V_1$ and $V_2$ appearing thereacross are additive and the two sources 20 and 21 are poled to pass current through both rectifiers in the forward direction. The current flowing through the rectifier 23 is effectively proportional to the input voltage $x$ while the current flowing through the rectifier 25 is proportional to the voltage $y$. Both of the rectifiers 23 and 25 are operated in the region where their forward characteristics are exponential, that is, in the region where Equation 2 above is valid, and, as a consequence, the voltage developed across each rectifier is a logarithmic function of the current therethrough. But the current through each rectifier is proportional to the applied input voltage and, as a result, the voltage $V_1$ developed across the rectifier 23 is a logarithmic function of the input voltage $x$, i.e., $V_1 \propto \ln x$ while the voltage $V_2$ appearing across the rectifier 25 is a logarithmic function of the input voltage $y$, i.e., $V_2 \propto \ln y$. The summation of the voltages appearing across the rectifiers 23 and 25 is indicated as $V_c$ and is impressed across a third p-n junction rectifier 26. The circuit components are selected so that the current flow $I_c$ through the rectifier 26 is much less than that flowing through either of the rectifiers 23 and 25 so that the rectifier 26 will operate in the exponential region of its forward characteristic where the current $I_c$ is a logarithmic function of the voltage $V_c$. The current $I_c$ may be measured by an ammeter 27. The current measured is, of course, proportional to anti logarithm of $V_c$ which is, in turn, proportional to the summation of $V_1$ and $V_2$. Since $V_1$ is proportional to the logarithm of $x$ and $V_2$ is proportional to the logarithm of $y$, it is apparent that the measured current $I_c$ is directly proportional to the product of $x$ and $y$. It will be recalled from the foregoing description that the function of a linear potentiometer is to provide an output which is proportional to the product of two inputs, i.e., $x$ and $y$, and, hence, it becomes obvious that the circuit shown in FIG. 1 performs the functions of a linear potentiometer. In essence the multiplication is performed by developing the logarithms of the two input signals across the input diodes, taking the sum of these logarithms and developing the antilogarithm across the output diode in order to obtain the product of the input signals.

Figure 2:
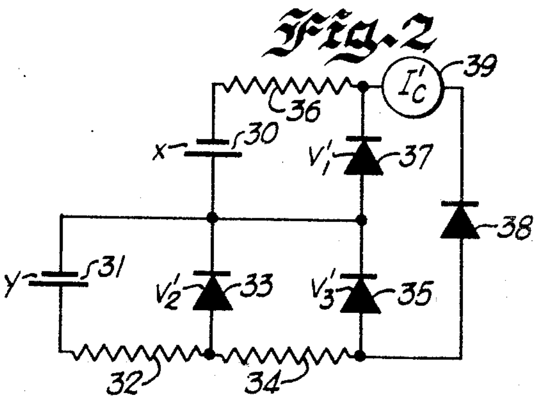
FIG. 2 is a schematic diagram illustrating another electronic multiplier circuit characterized by the features of the present invention and effective to act as a conventional logarithmic potentiometer.

Since a logarithmic function can be obtained by each of the diode-resistance sections of the type shown in FIG. 1, another such section connected in series with one of the input signals would provide a circuit as shown in FIG. 2 for performing the functions of a logarithmic potentiometer. More specifically, the circuit shown in FIG. 2 comprises two sources 30 and 31 of input voltages $x$ and $y$, a first resistance-diode section consisting of a resistor 32 and a p-n junction rectifier or diode 33, a second resistance-diode section consisting of a resistor 34 and a p-n junction rectifier or diode 35, a third resistance-diode section consisting of a resistor 36 and a p-n junction rectifier or diode 37, an output diode or rectifier 38 and an ammeter 39 for measuring the current flowing through the latter rectifier. The resistor of each resistance-diode section again has a resistance much greater than the forward resistance of the diode in that section. Moreover, all of the rectifiers of the circuit shown in FIG. 2 are again operated in the range where their forward characteristic is exponential. The sources 30 and 31 are poled to pass current through the rectifiers 33 and 37 in the forward direction with the current flow through the rectifier 37 being proportional to the input voltage $x$ and the current flow through the rectifier 33 being proportional to the input voltage $y$. The voltage $V_1'$ apeparing across the rectifier 37 is, of course, proportional to the logarithm of the current therethrough or to the logarithm of the input voltage $x$. Similarly, the voltage $V_2'$ developed across the rectifier 33 is proportional to the logarithm of $y$. The voltage $V_3'$ developed across the rectifier 35 is proportional to the logarithm of $V_2'$ or, more particularly, to the logarithm of ln $y$. The circuit components are again selected so that the forward current $I_c$ flowing through the rectifier 38 is less than that through any of the other diodes 33, 35 or 37. In view of the foregoing description, it will be apparent that the current $I_c$ is proportional to the product of $V_1'$ and $V_3'$ or, more specifically to $x \ln y$. Since it will be recalled that the function of a logarithmic potentiometer is to provide an output which varies as the product of a first input $x$ and the logarithm of a second input (ln $y$) corresponding to the setting of a mechanical control, it will be apparent that the circuit shown in FIG. 2 acts as a logarithm potentiometer by developing an output current $I_c'$ measured by the ammeter 39 and varying as a function of $x \ln y$.

Figure 3:
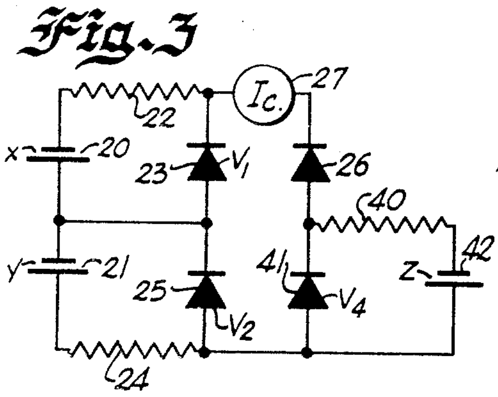
FIG. 3 is a schematic diagram illustrating another embodiment of the present invention which is similar to that shown in FIG. 1 but includes an additional diode for temperature compensation and for voltage reduction across the output.

In actual practice, the circuit illustrated in FIG. 1 is preferably modified by the addition of another resistance-diode section to provide temperature compensation and to reduce the voltage across the output diode 26 to make certain that the latter operates in the exponential region of its forward characteristic. The resulting circuit is shown in FIG. 3 which is identical to the circuit shown in FIG. 1 except for the addition of a resistor 40 and a p-n junction rectifier or diode 41 and their associated source 42 of voltage $z$. Since all other components of the circuits shown in FIGS. 1 and 3 are identical, the same reference numerals have been employed to identify corresponding elements. The voltage appearing across the diode 26 is equal to $V_1+V_2-V_4$ where $V_4$ is the voltage developed across the diode 41. Therefore, the diode 41 and its associated resistor 40 and voltage source 42 obviously reduce the voltage applied across the output diode 26 and, hence, facilitate operation of the latter diode in its exponential region. Moreover, any change in ambient temperature which tends to increase or decrease the voltages $V_1$ and $V_2$ will also cause a corresponding change in the voltage $V_4$ and the voltage across diode 26 thus providing temperature compensation. As the temperature increases, each input diode voltage will decrease by an equal amount $\Delta_v$. For optimum temperature compensation there should be an equal number of diodes poled in one direction as there are in the opposite direction in a closed circuit loop, so that the $\Delta_v$ factors of the diodes cancel or compensate for each other.

Figure 4:
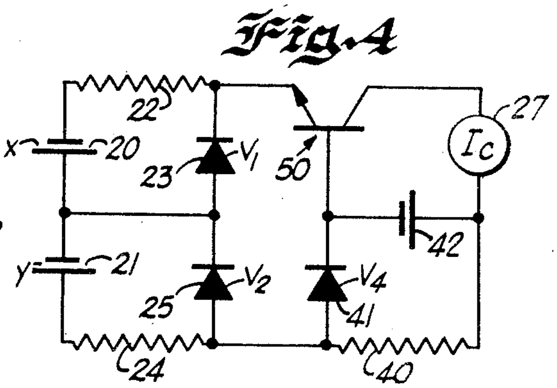
FIG. 4 is a schematic diagram illustrating a further embodiment of the invention which is similar to the circuit shown in FIG. 3 but employs a transistor in its output circuit for isolating the circuit load.

As is shown in FIG. 4, the circuit illustrated in FIG. 3, may be further modified by utilizing as the output rectifier the emitter to base junction of a transistor 50 and by connecting the ammeter 27 in the collector circuit of this transistor. Here again, since the remaining components of the circuits shown in FIGS. 3 and 4 are the same, identical reference numerals have been used to identify corresponding elements. The transistor 50 is illustrated as an n-p-n unit although this is unimportant since a p-n-p device could also be employed. In the form illustrated in FIG. 4, the power supply 42 is connected between the base and collector of the transistor to supply operating potential with the collector current flowing through the ammeter 27. The collector current is effectively equal to the emitter current and, hence, the measurement provided by the ammeter 27 is essentially the same as that provided in the circuit shown in FIG. 3. However, the transistor 50 prevents the resistance of the ammeter 27 or the circuit load from being introduced into the output rectifier circuit, i.e., the base to emitter junction of the transistor.

While in all of the circuits described above only two inputs are multiplied to produce an output representing the product of these inputs, it will be apparent that the teachings of the present invention may also be used to provide circuits for multiplying any number of inputs. Such a result is accomplished by connecting additional resistance-diode sections in cascade with those shown. The output current thus becomes proportional to the product of all of the input voltages applied to the cascaded sections.

Figure 5:
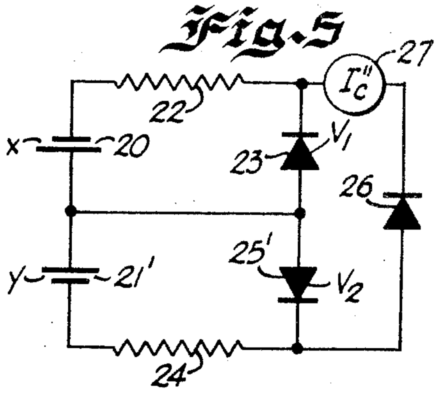
FIG. 5 is a schematic diagram illustrating an electronic divider circuit characterized by the features of the present invention.

While all of the circuits described above act as multipliers for the input voltage, the same principle may be used to construct a divider circuit. Since the logarithm of the quotient of two quantities is equal to the difference between the logarithms of the quantities, a divider circuit may be constructed merely by reversing one of the input diodes of the circuit shown in FIG. 1 as is shown in the circuit depicted in FIG. 5. In the latter circuit an input diode 25' is poled in the opposite direction from the corresponding diode 25 shown in FIG. 1 with a forward current being passed through the diode 25' from a source 21' of input voltage $y$. Since all other components of the systems shown in FIGS. 1 and 5 are the same, identical reference numerals have again been employed. The voltage applied across the output rectifier 26 of the circuit shown in FIG. 5 is, of course, equal to $V_1-V_2$ with $V_1$ being proportional to the logarithm of $x$ and $V_2$ being proportional to the logarithm of $y$. The current $I_c''$ flowing through the output rectifier is thus proportional to the quotient $x/y$ of the two input signals. The same principle may, of course, be employed to convert the multiplier circuits shown in FIGS. 2, 3 and 4 into divider circuits.

Figure 6:
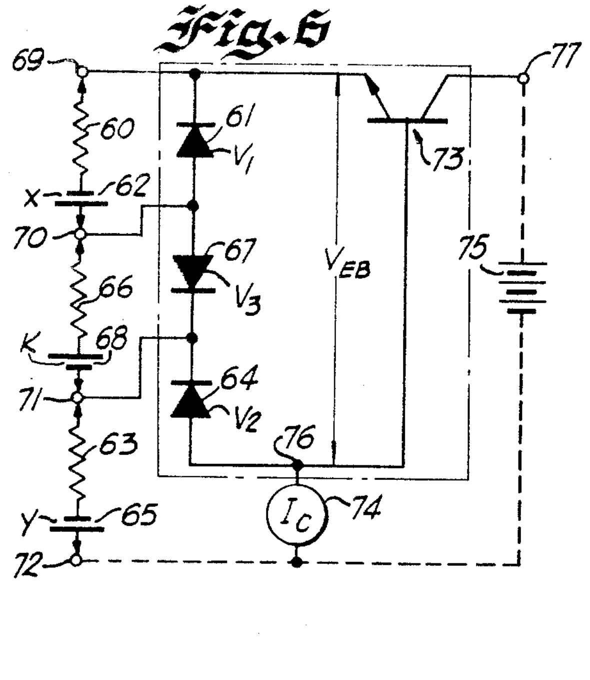
FIG. 6 is a schematic diagram illustrating a multiplier circuit comprising a still further embodiment of the invention which embodiment is well suited for construction as a monolithic semiconductor device.

In each of the multiplier circuits shown in FIGS. 1 to 4 the diode junctions are so connected that a p-type conductivity layer of one diode must be connected to an n-type conductivity layer of another diode. Connections of this type make these circuits poorly suited for construction as monolithic semiconductor devices. The circuit shown in FIG. 6 also performs a multiplication function but, at the same time, readily lends itself to monolithic semiconductor construction. The circuit there illustrated comprises a first input resistance-diode section consisting of a resistor 60, a p-n junction diode or rectifier 61 and a source 62 supplying a first input signal $x$, a second input resistance-diode section consisting of a resistor 63, a junction diode or rectifier 64 and a source 65 supplying a second input signal $y$, and a third input resistance-diode section consisting of a resistor 66, a junction diode or rectifier 67 poled in the opposite direction as the diodes 61 and 64 and a source 68 supplying a constant potential K. Each rectifier is biased in the forward direction by its associated source. The resistor 60 and the source 62 are connected in series across a pair of input terminals 69 and 70 while the resistor 63 and the source 65 are connected in series across a second pair of input terminals 71 and 72. The source 68 and the resistor 66 are conected in series across the terminals 70 and 71. The portion of the circuit enclosed by the dashed line in FIG. 6 is suitably formed upon a unitary block or wafer of semiconductor material in a manner described more fully below in connection with FIGS. 7 and 12 while other components are externally connected. As was indicated previously the resistor of each of the input resistance-diode sections has a much higher resistance than the forward resistance of the rectifier in that section so that each rectifier may be operated in the exponential range of its forward characteristic. In view of the foregoing description it will be recognized that the voltage $V_1$ developed across the rectifier 61 is proportional to the logarithm of $x$, while the voltage developed across the rectifier 64 is proportional to the logarithm of $y$ and the constant current flowing through the rectifier 67 develops a voltage $V_3$ across this rectifier proportional to the logarithm of K. The voltage $V_{EB}$ appearing across all of these diodes is applied across the base emitter junction of an output transistor 73 which performs the same functions as the transistor shown in FIG. 4 and described above. The voltage $V_{EB}$ is proportional to $\ln xy/k$. The transistor 73 performs the antilogarithm action by producing a collector current which is proportional to $xy/k$ and which may be measured by an ammeter 74. Operating potential for the transistor is supplied from a DC source 75. Thus, the multiplying function has been performed without requiring the connection of a p-type semiconductivity layer of one diode to an n-type semiconductivity layer of another diode. The concept of employing a forward biased diode having a constant current therethrough may be employed to facilitate the construction of any monolithic semiconductor device where the problem of connecting a p-type layer and an n-type layer exists.

In accordance with another feature of the present invention, the entire function of the portion of the circuit shown in solid lines in FIG. 6 may be built into a unitary monolithic body of a semiconductor material eliminating all leads except input and output leads required for the connection of the external circuit elements shown in broken lines. Further, the functions of only known components are present in this monolithic device.

For the purpose of clarity, the present invention will be described specifically in terms of preparing the device shown in FIG. 6 in a semiconductor silicon body. It will be understood, however, that in addition to silicon, other semiconductor materials, for example germanium or a semiconducting compound comprised, for example, of stoichiometric proportions of elements from Group III of the Periodic Table, for example, gallium, aluminum and indium, and elements from Group V, for example arsenic, phosphorus and antimony are suitable. Examples of suitable III–V stoichiometric compounds include gallium arsenide, gallium antimonide, gallium phosphide, indium arsenide and indium antimonide. It will also be understood that the silicon or other semiconductor may be processed so that the semiconductivity of the various regions may be reversed in preparing the devices although, in the preparation of the device shown in FIG. 6 where an n-p-n transistor is used, it is preferable that the starting material or wafer be formed of p-type semiconductivity material.

Figure 7:
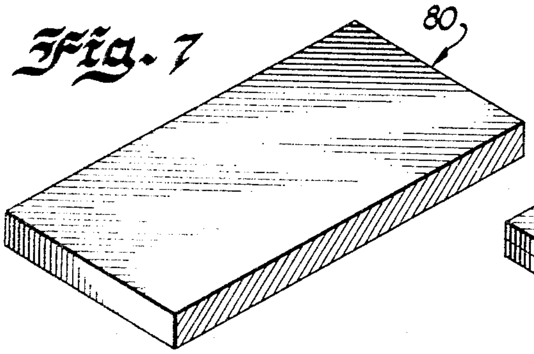
FIGS. 7 and 8 are perspective views of a portion of a wafer of semiconductor material being processed in accordance with the teachings of the present invention to produce a device for performing the functions of the circuit shown in FIG. 6.

With reference to FIG. 7, there is illustrated a portion of a single crystal silicon wafer 80 of p-type semiconductivity. The wafer 80 may be prepared by any of the methods known to those skilled in the art as, for example, by pulling a single-crystal silicon rod from a melt comprised of silicon and at least one element from Group III of the Periodic Table, for example, gallium, aluminum or indium. The wafer 80 is then cut from the rod in any suitable manner, for example, by using a diamond saw. The surface of the wafer may then be lapped or etched or both to produce a smooth surface after sawing. In addition, the semiconductor device of this invention may be prepared from a section of a dendritic crystal prepared in accordance with U.S. patent application Ser. No. 844,-288, filed Oct. 5, 1959, now Patent 3,031,403, issued April 24, 1962, the assignee of which is the same as that of the present invention.

The area of the block is largely determined by the desired characteristics of the p-n junction type diodes.

A layer of opposite conductivity type from the starting material of the wafer 80 may be formed in any conventional manner as, for example, by diffusion into one surface of the wafer a doping material which will change the conductivity type of the diffused layer. In the case of the p-type wafer 80, this diffusion may be accomplished by disposing the wafer in a diffusion furnace which has its hottest zone at a temperature within the range of 1100° C. to 1250° C. and has an atmosphere of the vapor of a donor doping material, for example, antimony, arsenic or phosphorus. The zone of the furnace within which a crucible of said donor impurity lies may be at a temperature of from 600° C. to 1250° C., the specific temperature being chosen to insure the desired vapor pressure and surface concentration of diffusant from the crucible. The donor impurity diffuses into the surface of the p-type wafer. Since the donor impurity will normally diffuse through all sides of the wafer it may be necessary to mask those sides or surfaces through which no diffusion is desired. Alternatively, the donor impurity may be allowed to diffuse through all of the surfaces of the wafer, and then the wafer may be abraded or etched, or both, in order to remove the diffused layer or layers from those surfaces or sides of the wafer through which no diffusion is desired.

Figure 8:
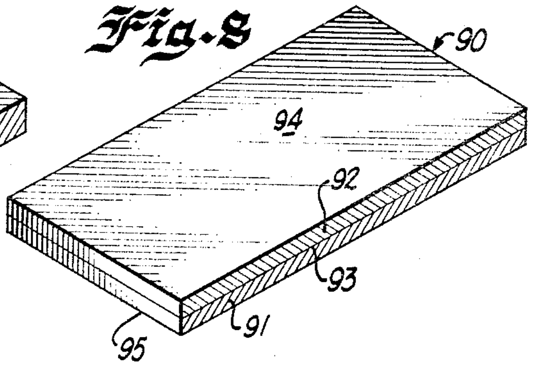

With reference to FIG. 8, there is illustrated a wafer 90 which illustrates the portion of the p-type wafer shown in FIG. 7 after diffusion of a doping impurity through only the top surface of the wafer, or where the diffused layer has been removed from all but the top portion of the wafer. The wafer 90 is comprised of a lower p-type layer 91 and an upper n-type layer 92 formed by the diffused impurity area. There is a p-n junction 93 formed at the boundary between the layers 91 and 92 and intermediate the top surface 94 and the bottom surface 95 of the wafer.

The depth of thickness of the n-type layer 92 is dependent primarily upon the desired design characteristics of the diodes of the completed multiplier circuit. In addition, this layer must be deep enough to permit the alloying or fusion of additional contacts to the top surface 94 without penetration entirely through the n-type layer 92 to the p-type layer 91.

Figures 9, 10, 11:
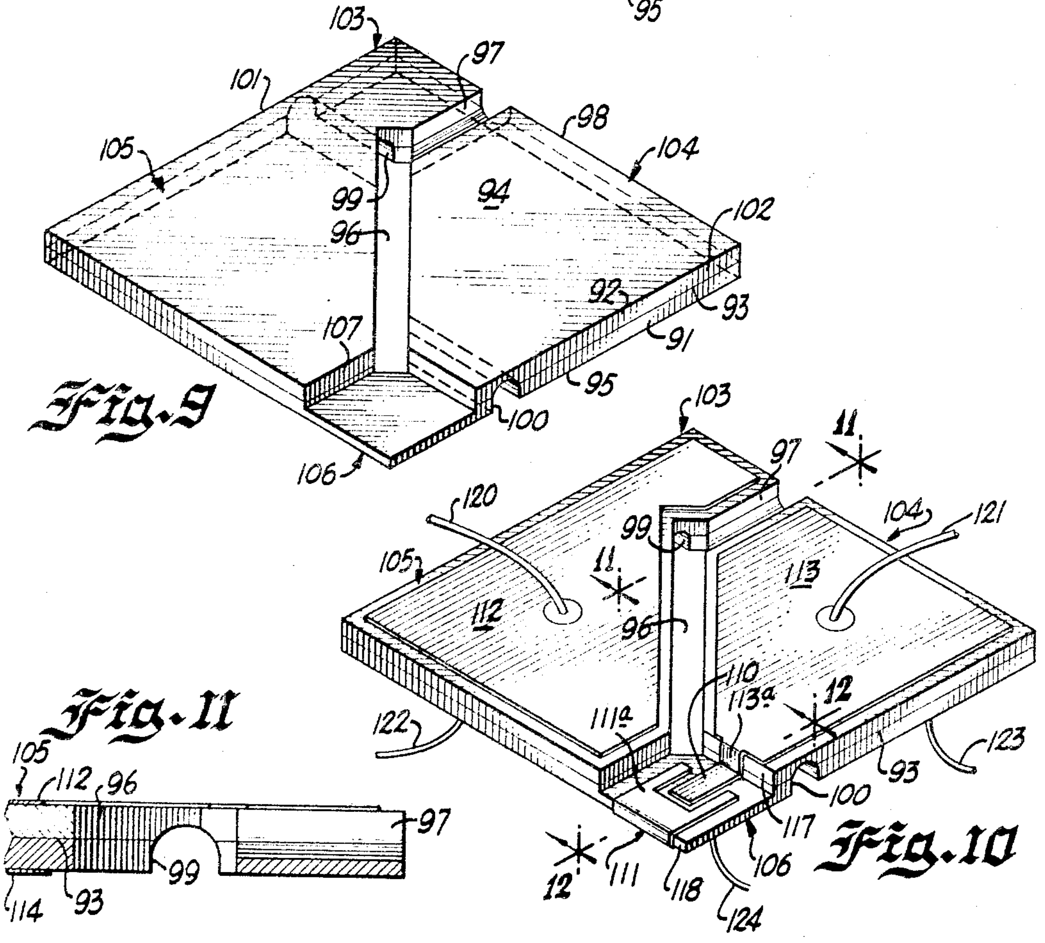
FIG. 9 is a perspective view of the semiconductor wafer being processed further in accordance with the teachings of the present invention.
FIG. 10 is a perspective view of a completed monolithic semiconductor device capable of performing the functions of the circuit shown in FIG. 6.
FIG. 11 is an enlarged, fragmentary, sectional view taken along the line 11—11 in FIG. 10.

Referring next to FIG. 9, it will be observed that the wafer is there shown after further treatment to form a slot or hole 96 extending diagonally across a portion of the wafer and between the flat parallel faces 94 and 95. A discontinuity in the layer 92 is formed by a groove or trough 97 extending inwardly of the wafer from the top surface 94 entirely through both the n-type layer 92 and the junction 93 with the inner end of the trough extending into but only partially through the p-type layer 91. The trough 97 terminates at one end at the slot or hole 96 and extends across a portion of the wafer top surface to a side edge 98 of the wafer. A pair of discontinuities are formed in the layer 91 by a pair of troughs 99 and 100 each of which extends inwardly from the bottom surface 95 and penetrates entirely through the p-type layer 91 and junction 93 with the upper end of each of these troughs protruding into but extending only partially through the n-type layer 92. The trough 99 also terminates at the one end at the slot or hole 96 and extends away from this hole to a second side edge 101 of the wafer while the trough 100 terminates at one end at the hole 96 and extends away from the hole to a third side edge 102 of the wafer. The grooves or troughs 97 and 99 and the hole or slot 96 cooperate to isolate a corner region 103 of the wafer from adjacent regions 104 and 105, while the trough 100 cooperates with the slot 96 to isolate another corner region 106 from the region 104. The upper n-type layer 92 of the wafer is removed in the corner region 106 to form a recessed area 107 having a depth sufficient to penetrate entirely through the layer 92 in order to insure that only material of p-type semiconductivity remains in this corner region.

The hole 96, the grooves or troughs 97, 99 and 100 and the recessed area 107 may be formed in any suitable manner as, for example, by sand blasting through a suitable mask or by ultrasonic drilling but, since both of these techniques leave roughened surfaces which require further treatment, the hole, the grooves and the recessed area are preferably formed by etching. To this end, the surfaces of the wafer 50 including the top surface 94 and the bottom surface 95 are coated with an acid resisting masking material, for example, Apiezon Wax. A portion of the masking material is removed from the area of the top surface 94 where the hole 96 is to be formed, from the area where the groove or trough 97 is to be formed and from the area of the top surface where the recessed area 107 is to be formed and similar portions are removed from the bottom surface 95 where the hole 96 is to be formed and from the area where the troughs 99 and 100 are to be formed. This may be accomplished by the use of a suitable scribe. The coated wafer 90 with the exposed surface portions is then etched with a suitable silicon etchant, for example, an etchant comprised of, all parts by volume, three parts nitric acid, one part hydrofluoric acid and one part acetic acid. The etching is continued until the scribed areas in the regions of the grooves or troughs 97, 99 and 100 and the recessed area 107 are etched to the desired depths. In the event that grooves or troughs of different depths are desired or if a recessed area 107 is desired having a different depth than one or more of the grooves, one of the areas is partially etched before the masking material is removed in the other regions with the result, of course, that the area which is exposed to the etchant for the greatest time has a deeper groove or trough formed therein. The etching of aligned exposed areas on the bottom and top surfaces of the wafer forms the hole 96. After the etching has been completed, the masking material is removed from the surfaces of the wafer.

Figure 12:
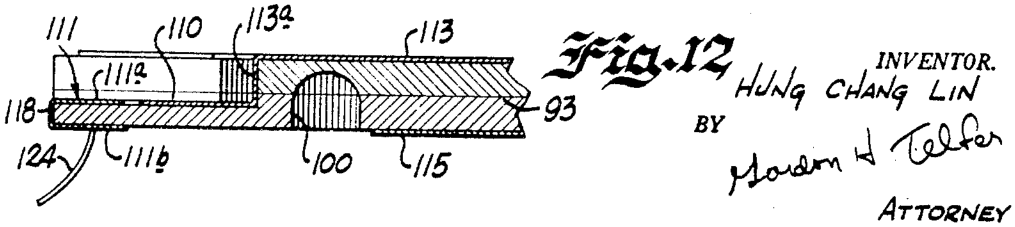
FIG. 12 is an enlarged, fragmentary, sectional view taken along the line 12—12 in FIG. 10.

With reference to FIGS. 10, 11 and 12, it will be observed that an emitter portion 110 of n-type semiconductivity, a collector portion 111 of n-type semiconductivity and ohmic contacts 112, 113, 114 and 115 are secured to the surface of the wafer 90 by disposing the respective materials, preferably in the form of shaped foils, upon the wafer surface and by then alloying or fusing them to the surface by heating in a vacuum of at least $10^{-2}$ mm. Hg and preferably higher for example $10^{-5}$ mm. Hg, at a temperature of from 400° C. to 700° C.

The emitter portion 110 and the collector portion 111 may be formed, for example, from a foil comprised of an alloy of a neutral metal, for example, gold, and at least one n-type doping material. Examples of suitable emitter alloys include an alloy comprised of from 99.0% to 99.5% gold, and 1% to 0.5% antimony. The emitter foil 110 covers only a small portion of the p-type layer 91 in the recessed corner region 106 and this foil extends along the top surface of the region 106 and upwardly along a portion of the side wall 117 of the recessed area. The collector foil 111 is preferably formed in two portions **111*a* and 111*b* with the portion 111*a* being bifurcated to form legs straddling the end of the emitter foil 110. The legs of the foil portion 111*a* are, of course, spaced from the emitter foil and the end of the foil portion 111*a* extends downwardly along one side edge 118 of the p-type layer in the corner region 106. The foil portion 111*b*, which is best shown in FIG. 12, covers a portion of the bottom surface of the corner region 106 and exends upwardly along the side edge 118 to overlap the downwardly extending end of the foil portion 111*a***.

The p-type ohmic contacts 114 and 115 may be formed from, for example, a layer comprised of at least one suitable p-type material, for example, boron, aluminum, gallium or indium, or the layer may be in the form of a foil comprised of an alloy of a neutral metal, for example, gold and at least one p-type doping material. An example of a suitable alloy is one including a major portion of gold and about 0.1% boron. The foil 114, as is shown in FIG. 11, underlies the bottom of the p-type layer 91 in the region 105 and is shaped to cover a major portion of this region. This foil stops short of the groove 99 and the slot 96 and, hence, does not extend under any of the other regions 102, 104 or 106. The foil 115, as is shown in FIG. 12, underlies the p-type layer 91 in both of the regions 103 and 104 and is shaped to extend beneath substantially all of these two regions. The foil 115 also ends short of the trough 100 and the slot 96 and does not extend beneath the other two regions 105 or 106.

The ohmic contact 112 may be formed from a foil comprised of a neutral metal, preferably gold and an n-type doping material such as antimony, phosphorus or arsenic. It will be noted that the foil 112 overlies the n-type layer 92 over a major portion of the region 105 and also over most of the corner region 103. The ohmic contact 113 is preferably formed of a neutral metal such as gold and this foil covers a major portion of the top surface of the region 104 and has a tab **113*a* at one end extending downwardly along the wall 114 to overlap the upwardly extending end of the emitter foil 110**.

A suitable thickness of the foils employed to form the emitter and collector portions and the ohmic contacts 112, 113, 114 and 115 can be determined from a component phase diagram and the thickness of the layers 91 and 92. The temperature at which the foils are alloyed to the wafer depends to a degree upon the composition of the foils. If no aluminum is present the fusion or alloying can be carried out at a temperature as low as 400° C. However, if the foils contain a relatively high percentage of aluminum a temperature of about 600° C. is required.

During the alloying and fusion of the emitter foil 110 and the ohmic contacts 112, 113, 114 and 115 to the surface of the wafer 90, the overlapping portions of the collector foil portions along the side edge 118 are fused together to form a continuous electrical connection between the foil portions **111*a* and 111*b* and, at the same time, the tab 113*a* of the ohmic contact 113, is fused to the emitter foil 110 along the wall 117**.

The use of gold and a doping material to form the ohmic contacts 112, 114 and 115 insures a good ohmic contact between the wafer and each of these contacts and permits the fusion to be carried out well below the melting point of gold. It will be understood, of course, that the fusion and alloying step described above can be carried out in a jig or other suitable apparatus to insure that the various foils remain in position during the fusion and alloying.

After the fusion and alloying step has been completed, leads for connection to the external circuit components are secured, as by soldering, to the ohmic contacts 112, 113, 114 and 115 and to the collector portion 111. Thus, a lead or conductor 120 is secured at one end to the ohmic contact 112 and at its other end is attached to the terminal 71 of the circuit shown in FIG. 6. A second lead or conductor 121 is secured at one end to the ohmic contact 113 and at its other end is connected to the terminal 69 of the circuit shown in FIG. 6. A third lead or conductor 122 has one end secured to the ohmic contact 114 and has its other end connected to the circuit terminal 76 while a fourth lead or conductor 123 is connected between the ohmic contact 115 and the circuit terminal 70. A fifth lead or conductor 124 is secured at one end to the portion **111*b* of the collector foil 111 and at its other end is connected to the circuit terminal 77**.

In view of the foregoing description it will be observed that the junction 93 between the layers 91 and 92 in the region 104 provides a p-n junction for performing the function of the diode 61 of the circuit shown in FIG. 6, while the junction between the layers 91 and 92 in the region 103 performs the function of the diode 67 and the junction between the layers 91 and 92 in the region 105 performs the function of the diode 64. The emitter portion 110, the collector portion 111 and the p-type base layer 91 in the corner region 106 cooperate to perform the function of the n-p-n type transistor 73. The emitter of the latter transistor is connected to the n-type layer of the diode in the region 104 through the fused, overlapping portions of the foils 111 and **113*a* lying along the wall 117. The base layer of the transistor is integral with the p-type layer in the region 105 thus providing the connection from the transistor base to the circuit terminal 76 via the ohmic contact 114 and the conductor 122 and also providing the connection between the transistor base and the p-type layer of the diode 64. The n-type layer of the latter diode is, of course, integral with the n-type layer in the region 103 serving as the diode 67 and this integral layer is connected to the circuit terminal 71 via the ohmic contact 112 and the conductor 120. Finally, the p-type layer of the region 103 forming the diode 67 is integral with the p-type layer of the region 104 forming the diode terminal 70 via the ohmic contact 115 and the conductor 123**.

Thus, it will be observed that the completed monolithic semiconductor device shown in FIG. 10 is effective to perform all of the functions of the circuit elements shown in solid lines in FIG. 6. All of the latter circuit elements are formed on a single unitary wafer of semiconductor material and are effectively interconnected without requiring the use of external leads or connections.

The wafer formed is very small and light and, hence, this device is well suited for use in missiles and aircraft guidance systems where miniaturization of components is a primary objective. As was described in detail above, the monolithic semiconductor device formed cooperates with two input signals to develop an output proportional to these input signals.

I claim as my invention:

1. Apparatus for obtaining an output which is a function of at least two input signals, said apparatus comprising a first rectifying junction operating in the exponential range of its forward characteristic and biased in the forward direction by a first of said input signals in order to pass a forward current therethrough for developing across said first rectifying junction a first voltage proportional to the logarithm of the first input signal, a second rectifying junction operating in the exponential range of its forward characteristic and biased in the forward direction by a second of said input signals in order to pass a forward current therethrough for developing across a second rectifying junction a second voltage proportional to the logarithm of the second input signal, said first and second rectifying junctions being connected in series so that the combined voltage appearing across both rectifying junctions is the algebraic sum of said first and second voltages, and an output circuit connected across said first and second rectifying junctions and including a third rectifying junction operating in the exponential range of its forward characteristic, said third rectifying junction having a forward current therethrough proportional to the antilogarithm of the combined voltage appearing across said first and second rectifying junctions.

2. Apparatus for obtaining an output which is the product of at least two input signals, said apparatus comprising a first rectifying junction operating in the exponential range of its forward characteristic and biased in the forward direction by a first of said input signals in order to pass a forward current therethrough for developing across said first rectifying junction a first voltage proportional to the logarithm of the first input signal, a second rectifying junction operating in the exponential range of its forward characteristic and biased in the forward direction by a second of said input signals in order to pass a forward current therethrough for developing across said second rectifying junction a second voltage proportional to the logarithm of the second input signal, said first and second rectifying junctions being poled in the same direction and being connected in series so that the combined voltage appearing across both rectifying junctions is the sum of the absolute values of said first and second voltages, and an output circuit connected across said first and second rectifying junctions and including a third rectifying junction operating in the exponential range of its forward characteristic, said third rectifying junction having a forward current therethrough proportional to the anti-logarithm of the combined voltage appearing across said first and second rectifying junctions, whereby the latter current is proportional to the product of said input signals.

3. Apparatus for obtaining an output which is a function of the quotient of two input signals, said apparatus comprising a first rectifying junction operating in the exponential range of its forward characteristic and biased in the forward direction by a first of said input signals in order to pass a forward current therethrough for developing across said first rectifying junction a first voltage proportional to the logarithm of the first input signal, a second rectifying junction operating in the exponential range of its forward characteristic and biased in the forward direction by a second of said input signals in order to pass a forward current therethrough for developing across said second rectifying junction a second voltage proportional to the logarithm of the second input signal, said first and second rectifying junctions being poled in the opposite direction and being connected in series so that the combined voltage appearing across both rectifying junctions is the difference between the absolute values of said first and second voltages, and an output circuit connected across said first and second rectifying junctions and including a third rectifying junction operating in the exponential range of its forward characteristic, said third rectifying junction having a forward current therethrough proportional to the antilogarithm of the combined voltage appearing across said first and second rectifying junctions, whereby the latter current is proportional to the quotient of the input signals.

4. Apparatus for obtaining an output which is a function of at least two input signals, said apparatus comprising a first diode operating in the exponential range of its forward characteristic and biased in the forward direction by a first of said input signals in order to pass a forward current through said first diode for developing across said first diode a first voltage proportional to the logarithm of the first input signal, a second diode operating in the exponential range of its forward characteristic and biased in the forward direction by a second of said input signals in order to pass a forward current through said second diode for developing across said second diode a second voltage proportional to the logarithm of the second input signal, said first and second diodes being connected in series so that the combined voltage appearing across both diodes is the algebraic sum of said first and second voltages, and an output circuit connected across said first and second diodes and including a transistor having a rectifying junction formed between a pair of input electrodes, said rectifying junction having applied thereacross a voltage proportional to said combined voltage and operating in the exponential range of its forward characteristic, said transistor having an output electrode providing an output current proportional to the antilogarithm of the combined voltage.

5. Apparatus for obtaining an output which is a function of at least two input signals, said apparatus comprising a first rectifying junction operating in the exponential range of its forward characteristic and biased in the forward direction by a first of said input signals in order to pass a forward current therethrough for developing across said first rectifying junction a first voltage proportional to the logarithm of the first input signal, a second rectifying junction operating in the exponential range of its forward characteristic and biased in the forward direction by a second of said input signals in order to pass a forward current therethrough for developing across said second rectifying junction a second voltage proportional to the logarithm of the second input signal, said first and second rectifying junctions being connected in series so that the combined voltage appearing across both rectifying junctions is the algebraic sum of said first and second voltages, and an output circuit connected across said first and second rectifying junctions and including a third rectifying junction operating in the exponential range of its forward characteristic, said third retifying junction having a forward current therethrough proportional to the antilogarithm of the combined voltage appearing across said first and second rectifying junctions, said output circuit including a fourth rectifying junction poled in the same direction as the third rectifying junction and means for supplying a forward current through said fourth rectifying junction to provide temperature compensation.

6. Apparatus for obtaining an output which is a function of at least two input signals, said apparatus comprising a first diode operating in the exponential range of its forward characteristic and biased in the forward direction by a first of said input signals in order to pass a forward current through said first diode for developing across said first diode a first voltage proportional to the logarithm of the first input signal, a second diode operating in the exponential range of its forward characteristic and biased in the forward direction by a second of said input signals in order to pass a forward current through said second diode for developing across said second diode a second voltage proportional to the logarithm of the second input signal, said first and second diodes being connected in series so that the combined voltage appearing across both diodes is the algebraic sum of said first and second voltages, and an output circuit connected across said first and second diodes and including a transistor having a rectifying junction between a pair of input electrodes, said rectifying junction having applied thereacross a voltage proportional to said combined voltage and operating in the exponential range of its forward characteristic, said transistor having an output electrode providing an output current proportional to the antilogarithm of the combined voltage, said output circuit further including a third diode poled in the same direction as said rectifying junction and means for passing a forward current through said third diode to reduce the voltage applied across said rectifying junction and to provide temperature compensation.

7. Apparatus for obtaining an output which is a function of a plurality of input signals, said apparatus comprising a plurality of cascade connected input circuits each including a rectifier operating in the exponential range of its forward characteristic, the rectifiers of the different input circuits being respectively biased for current conduction in the forward direction by said input signals in order to produce across each rectifier a voltage proportional to the logarithm of its biasing input signal, and an output circuit jointly responsive to the algebraic sum of the individual voltages developed across all of said rectifiers and including a further rectifier operating in the exponential range of its forward characteristic, said further rectifier developing a forward current therethrough proportional to the antilogarithm of said algebraic sum of said individual voltages.

8. Electronic apparatus capable of performing signal multiplication or division and comprising: first, second and third means each comprising a rectifying junction having a forward characteristic including a region wherein the voltage is a logarithmic function of the current; said first, second and third means being electrically coupled so that the algebraic sum of electrical output signals of said first and second means are applied to said third means to produce an electrical output signal from said third means which is proportional to the product or quotient of input electrical signals applied to said first and second means.

9. Electronic apparatus capable of performing signal multiplication or division and comprising: a unitary body of semiconductive material including semiconductive regions forming first, second and third rectifying junctions each having a forward characteristic including a region wherein the voltage is a logarithmic function of the current; said semiconductive regions being electrically coupled to form a series combination of said semiconductive regions forming said first and second rectifying junctions with said series combination being in parallel with said semiconductive regions forming said third rectifying junction; first means to apply a first forward current to said first rectifying junction; second means to apply a second forward current to said second rectifying junction; and means to measure the current through said third rectifying junction so that upon application of said first and second forward currents to said first and second rectifying junctions to place them in said region of their forward characteristic the forward voltages developed thereacross are algebraically imposed across said third rectifying junction to produce an output current proportional to the product or quotient of the input currents applied to said first and second rectifying junctions.

10. Electronic apparatus in accordance with claim 9 wherein: said first and second rectifying junctions in said series combination are poled in the same direction and said output current is proportional to the product of said input currents.

11. Electronic apparatus in accordance with claim 9 wherein: said first and second rectifying junctions in said series combination are poled in opposite directions and said output current is proportional to the quotient of said input currents.

12. Electronic apparatus in accordance with claim 9 wherein: said semiconductive regions forming said third rectifying junction are the emitter and base regions of a transistor so that measurement of said output current can be performed in the collector circuit of said transistor.

13. Electronic apparatus in accordance with claim 9 wherein: said first means comprises a first source of input voltage connected across said first rectifying junction and a first resistance in series with said first rectifying junction, said first resistance being large compared with the forward resistance of said first rectifying junction; said second means comprises a second source of input voltage connected across said second rectifying junction and a second resistance in series with said second rectifying junction, said second resistance being large compared with the forward resistance of said second rectifying junction; said first and second sources of input voltage producing first and second currents through said first and second rectifying junctions, respectively, at said region in the forward characteristic where the voltage across the junction is a logarithmic function of the current.

14. Electronic apparatus in accordance with claim 9 wherein: said first means comprises semiconductive regions forming a fourth rectifying junction connected in parallel with said semiconductive regions forming said first rectifying junction and in series with said semiconductive regions forming said second rectifying junction, said fourth rectifying junction having a forward characteristic including a region wherein the voltage is a logarithmic function of the current.

15. Electronic apparatus in accordance with claim 9 further comprising: semiconductive regions forming an additional rectifying junction in series with said regions forming said third rectifying junction and in parallel with said semiconductive regions forming said first and second semiconductive regions to provide temperature compensation and reduce the voltage across said third rectifying junction.

References Cited

UNITED STATES PATENTS 2,920,828 1/1960 Davis ---------------- 235—194
3,017,106 1/1962 Patterson --------- 235—195 X MALCOLM A. MORRISON, *Primary Examiner.*

J. F. RUGGIERO, *Assistant Examiner.*

U.S. Cl. X.R.

307—229, 299